(12) United States Patent
Kirby et al.

(10) Patent No.: US 9,966,406 B2
(45) Date of Patent: May 8, 2018

(54) SEMICONDUCTOR DEVICES INCLUDING BACK-SIDE INTEGRATED CIRCUITRY

(71) Applicant: Micron Technology, Inc., Boise, ID (US)

(72) Inventors: Kyle K. Kirby, Boise, ID (US); Steve Oliver, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 15/299,103

(22) Filed: Oct. 20, 2016

(65) Prior Publication Data

US 2017/0040375 A1    Feb. 9, 2017

Related U.S. Application Data

(60) Continuation of application No. 14/207,972, filed on Mar. 13, 2014, now Pat. No. 9,484,378, which is a
(Continued)

(51) Int. Cl.
*H01L 31/062* (2012.01)
*H01L 27/146* (2006.01)

(52) U.S. Cl.
CPC .. *H01L 27/14636* (2013.01); *H01L 27/14612* (2013.01); *H01L 27/14625* (2013.01); *H01L 27/14632* (2013.01); *H01L 27/14643* (2013.01)

(58) Field of Classification Search
CPC ......... H01L 27/14636; H01L 27/14612; H01L 27/14625; H01L 27/14632; H01L 27/14643
See application file for complete search history.

(56) References Cited

U.S. PATENT DOCUMENTS 5,317,433 A    5/1994  Miyawaki et al.
5,414,284 A    5/1995  Baxter et al.
(Continued)

FOREIGN PATENT DOCUMENTS

JP    2004165602         6/2004
JP    2006093587 A      4/2006

OTHER PUBLICATIONS

Bock et al., "Characterization of electrostatic carrier substrates to be used as a support for thin semiconductor wafers," Fraunhofer Institute for Reliability and Microintegration IZM-, CS MANTECH, 20th International Conference on Compound Semiconductor Manufacturing Technology 2005: New Orleans, Louisiana, Apr. 11-14, 2005.
(Continued)

*Primary Examiner* — Victor A Mandala
*Assistant Examiner* — Colleen E Snow
(74) *Attorney, Agent, or Firm* — TraskBritt

(57) ABSTRACT

Semiconductor devices may include a semiconductor substrate comprising at least one of transistors and capacitors may be located at an active surface of the semiconductor substrate. An imperforate dielectric material may be located on the active surface, the imperforate dielectric material covering the at least one of transistors and the capacitors. Electrically conductive material in contact openings may be electrically connected to the at least one of transistors and capacitors and extend to a back side surface of the semiconductor substrate. Laterally extending conductive elements may extend over the back side surface of the semiconductor substrate and may be electrically connected to the conductive material in the contact openings. At least one laterally extending conductive element may be electrically connected to a first transistor or capacitor and may extend laterally underneath a second, different transistor or capaci-
(Continued)

tor to which the laterally extending conductive element is not electrically connected.

20 Claims, 14 Drawing Sheets

Related U.S. Application Data continuation of application No. 13/198,533, filed on Aug. 4, 2011, now Pat. No. 8,679,933, which is a division of application No. 11/761,904, filed on Jun. 12, 2007, now Pat. No. 8,017,982.

(56) References Cited

U.S. PATENT DOCUMENTS

| | | | |
|---|---|---|---|
| 5,841,197 A * | 11/1998 | Adamic, Jr. | ........ H01L 21/2007 257/500 |
| 5,939,789 A | 8/1999 | Kawai et al. | |
| 6,169,319 B1 | 1/2001 | Malinovich et al. | |
| 7,161,231 B2 | 1/2007 | Koike | |
| 7,265,402 B2 | 9/2007 | Koyanagi | |
| 7,816,231 B2 | 10/2010 | Dyer et al. | |
| 8,017,982 B2 | 9/2011 | Kirby et al. | |
| 8,679,933 B2 | 3/2014 | Kirby et al. | |
| 2005/0029643 A1 | 2/2005 | Koyanagi | |
| 2005/0121737 A1 | 6/2005 | Fan et al. | |
| 2006/0105449 A1 * | 5/2006 | Larmer | ................. B01L 3/5085 435/287.2 |
| 2007/0007556 A1 | 1/2007 | Shibayama | |
| 2007/0052056 A1 | 3/2007 | Doi | |
| 2007/0158713 A1 | 7/2007 | Ohkawa | |
| 2007/0278619 A1 | 12/2007 | Clevenger et al. | |
| 2011/0287572 A1 | 11/2011 | Kirby et al. | |
| 2014/0191303 A1 | 7/2014 | Kirby et al. | |

OTHER PUBLICATIONS

International Preliminary Report on Patentability for International Application No. PCT/US2008/066489 dated Dec. 17, 2009, 4 pages.
International Search Report for International Application No. PCT/US2008/066489 dated Oct. 21, 2008, 3 pages.
International Written Opinion for International Application No. PCT/US2008/066489 dated Oct. 21, 2008, 3 pages.

* cited by examiner

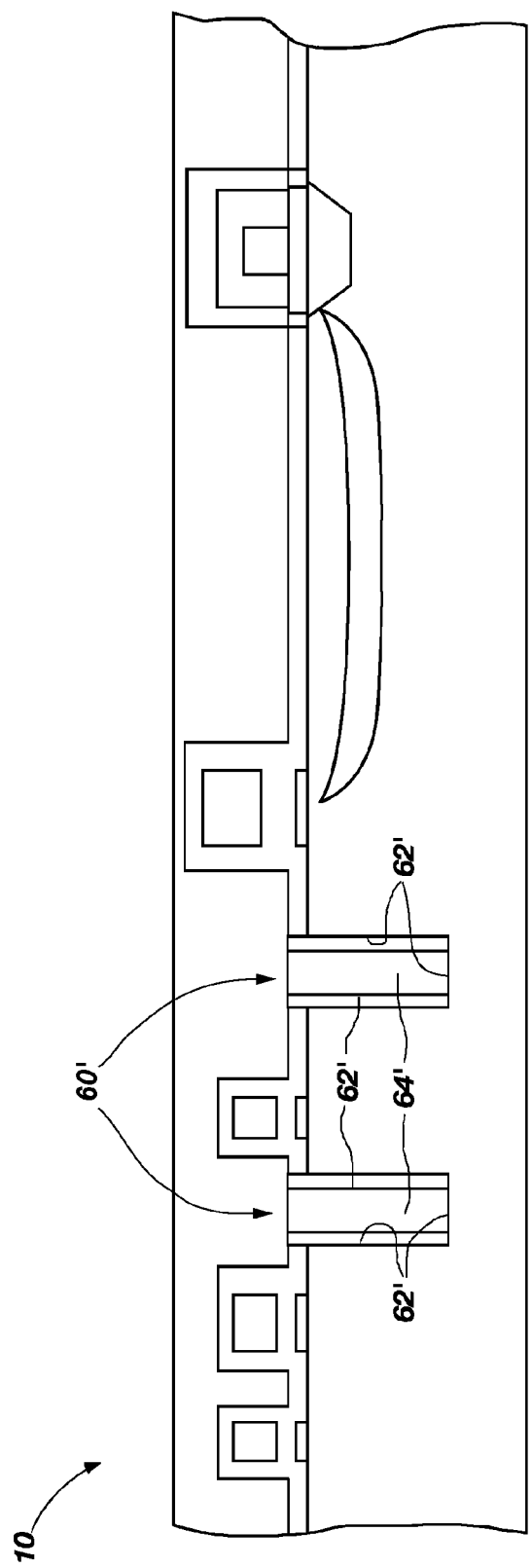

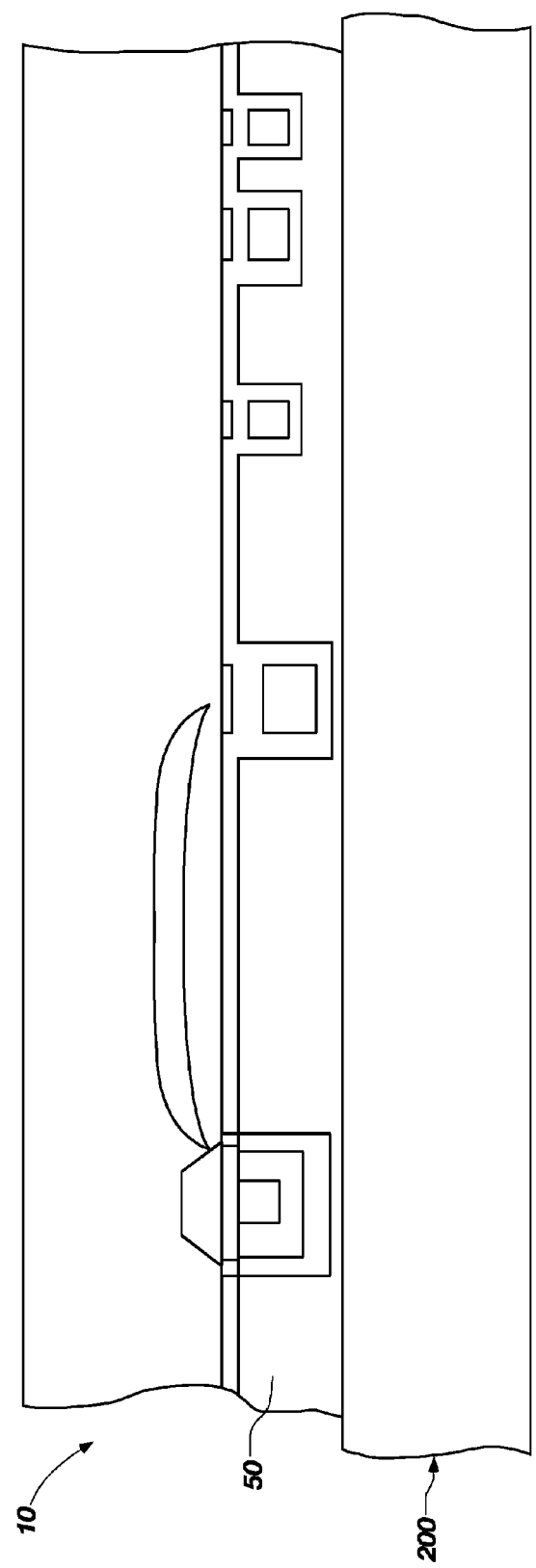

SEMICONDUCTOR DEVICES INCLUDING BACK-SIDE INTEGRATED CIRCUITRY

CROSS-REFERENCE TO RELATED APPLICATIONS

This application is a continuation of U.S. patent application Ser. No. 14/207,972, filed Mar. 13, 2014, now U.S. Pat. No. 9,484,378, issued Nov. 1, 2016, which is a continuation of U.S. patent application Ser. No. 13/198,533, filed Aug. 4, 2011, now U.S. Pat. No. 8,679,933, issued Mar. 25, 2014, which is a divisional of U.S. patent application Ser. No. 11/761,904, filed Jun. 12, 2007, now U.S. Pat. No. 8,017,982, issued Sep. 13, 2011, the disclosure of each of which is incorporated in this disclosure in its entirety by this reference.

FIELD

The present invention, in various embodiments, relates generally to methods for fabricating photoimagers, such as complementary metal-oxide-semiconductor (CMOS) imagers, which are also referred to herein more simply as "imagers." More specific embodiments of the present invention include imager fabrication methods in which transistors are fabricated on an active surface of a substrate, then contact openings, contact plugs, metallization, and contact pads are formed on and from a back side of the substrate. In addition, embodiments of the present invention comprise imagers with integrated circuitry on the back sides thereof.

BACKGROUND

Conventionally, imagers have been fabricated with image sensing regions, integrated circuitry, and contacts on the active surface of a silicon wafer. State-of-the-art semiconductor devices, including imagers, typically have dimensions that are as small as possible. Nonetheless, a significant portion of the area, or real estate, on the active surface of an imager is typically occupied by image sensing elements. Accordingly, various other elements, including conductive lines, or traces, must be densely packed into the remaining, typically peripheral, areas of the semiconductor device. When conductive lines, or traces, are densely arranged, cross-talk, capacitance, and other undesirable electrical issues must be resolved. The difficulty in resolving these issues increases the more densely the conductive lines are arranged.

Another factor that sometimes undesirably adds to the area consumed by an imager is the so-called "snowplow" effect that occurs when color filter array (CFA) materials are applied (e.g., by spin coating) over imagers in which the dielectric material (e.g., glass) that overlies the image sensing elements has been thinned relative to the surrounding areas of the imager. Specifically, a peripheral "dead" zone is provided around an array of image sensing elements to accommodate thicker regions of color filter array material so as to avoid the presence of these thicker, or snowplowed, regions over the image sensing elements. The requirement of additional area prevents further decreases in the total area consumed by the imager, or introduces the additional complexities involved in increasing the density of the peripherally confined elements of the imager.

Furthermore, the presence of bond pads on the active surfaces of imagers necessitates that bond wires or other laterally extending intermediate conductive elements be used to electrically connect such imagers to carriers (e.g., circuit boards) and to other electronic components. As bond wires and other laterally extending intermediate conductive elements extend beyond the periphery of an imager to contacts (e.g., terminals) located outside of the periphery of the imager, they and the contacts occupy even more of the real estate upon the carrier, the value of which increases with decreases in acceptable electronic device dimensions.

Several approaches have been taken to address this undesirable occupation of real estate upon carriers for imagers. One approach has been to form through wafer interconnects (TWIs), or conductive vias, through the substrate of an imager. This approach requires that holes be formed through areas of the imager substrate that are not occupied by image sensing elements or integrated circuitry. The requirement of such "dead" area on a substrate, however, contradicts the trend toward maximized density and, thus, prevents optimal minimization of the dimensions of an imager. The other approach has been to form conductive elements that extend around the outer periphery of the imager substrate, which enables optimal circuit density, but effectively adds to the outer dimensions of the finished semiconductor device. Further, any redistribution layers (RDLs), or redistribution circuitry, required by both of these approaches undesirably adds to the overall thickness and cost of the imager.

Accordingly, there are needs for processes in which undesirable electrical effects of imagers may be reduced and contacts may be fabricated on the back sides of imagers while facilitating minimization of the peripheral dimensions of the imagers.

BRIEF DESCRIPTION OF THE DRAWINGS

In the drawings, in which various features of embodiments of the present invention are depicted:

FIGS. 1 through 10 are partial cross-sectional representations of imagers under fabrication in accordance with embodiments of the present invention;

DETAILED DESCRIPTION

The present invention includes various embodiments of methods for fabricating imagers. Such methods include the fabrication of image sensing elements and transistors on the active surface of a substrate and the fabrication of contact openings, contact plugs, conductive lines, and contacts on and from the back side of the substrate.

Figure 1:
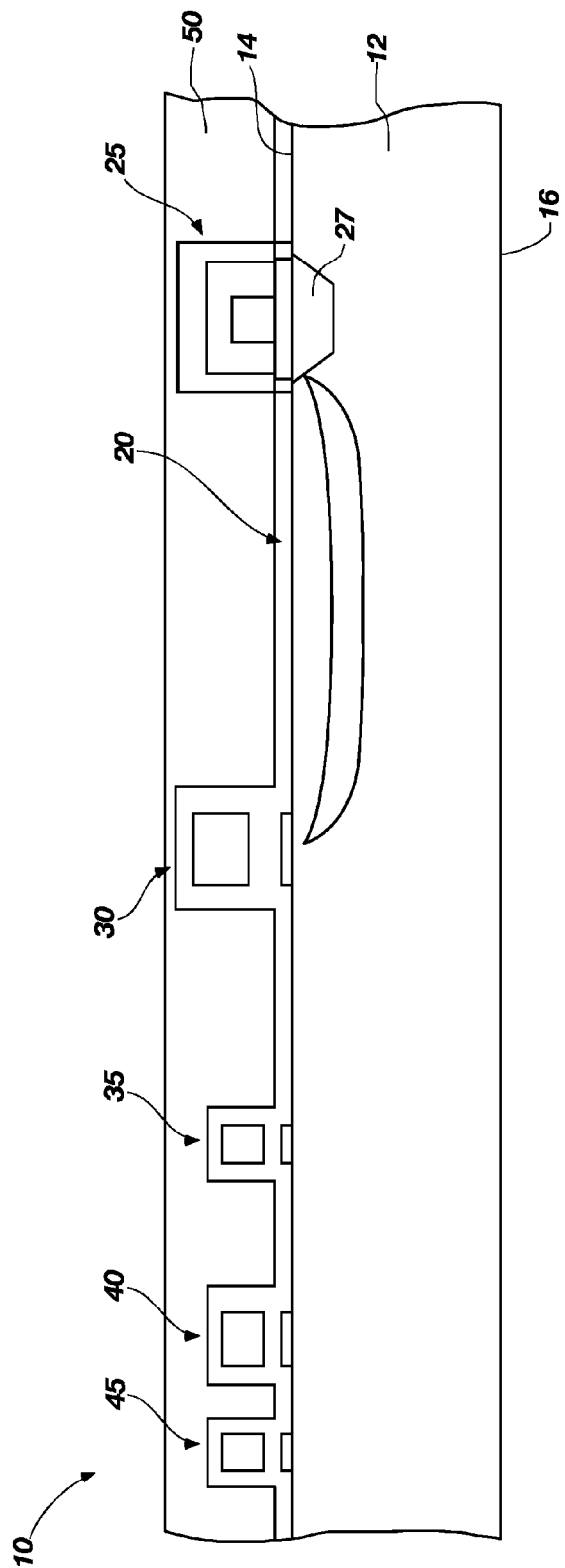

With reference to FIG. 1, an embodiment of a portion of a partially fabricated, or intermediate, imager 10 is illustrated. Imager 10 includes a substrate 12, comprising a fabrication substrate, such as a full or partial wafer of semiconductor material (e.g., silicon, gallium arsenide, indium phosphide, etc.), a full or partial silicon-on-insulator (SOI) type substrate, such as a silicon-on-glass (SOG), silicon-on-ceramic (SOC), or silicon-on-sapphire (SOS) substrate, or any other known, suitable fabrication substrate. Substrate 12 has an active surface 14 and a back side 16.

In addition, imager 10 includes a variety of elements that have been fabricated by known processes. In the illustrated embodiment, in which features corresponding to only one pixel of imager 10 are shown, imager 10 includes at least one image sensing element 20 in active surface 14 of substrate, as well as a photocell capacitor 25 and its underlying shallow trench isolation (STI) structure 27, and a transfer gate 30, a reset gate 35, a source follower gate 40, a row select gate 45, and appropriate source and drain regions (not shown) that correspond to image sensing element 20. Transfer gate 30, reset gate 35, source follower gate 40, row select gate 45, and their respective source and drain regions are collectively referred to hereinafter as "imager transistors 30-45." Like image sensing element 20, photocell capacitor 25, STI structure 27, and imager transistors 30-45 may also be located at active surface 14.

Optionally, as shown in FIG. 1A, imager 10 may include contact holes 60' that extend into substrate 12 through active surface 14. In the depicted embodiment, contact holes 60' are blind vias. The distance (e.g., diameter, etc.) across a contact hole 60' may be about 200 nm or less. In some embodiments, the distance across a contact hole 60' may be as small as about 100 nm, about 50 nm, or less. Each contact hole 60' may contain a dielectric liner 62' and a contact plug 64'. When present, these features may be fabricated in any suitable manner known in the art, or in a manner similar to that described in reference to FIGS. 3 through 7 below.

Imager 10 also includes a dielectric film 50 (e.g., doped silicon dioxide, such as borophosphosilicate glass (BPSG), borosilicate glass (BSG), phosphosilicate glass (PSG) or the like, etc., see FIG. 1), over image sensing element 20, photocell capacitor 25, and imager transistors 30-45. Dielectric film 50 may be applied in a thickness of about one-half micron (0.5 μm) or less. Following its application, an exposed surface of dielectric film 50 may, in some embodiments, be planarized. Known planarization techniques, such as chemical-mechanical polishing (CMP), may be used to planarize the exposed surface of dielectric film 50.

Figure 1B:
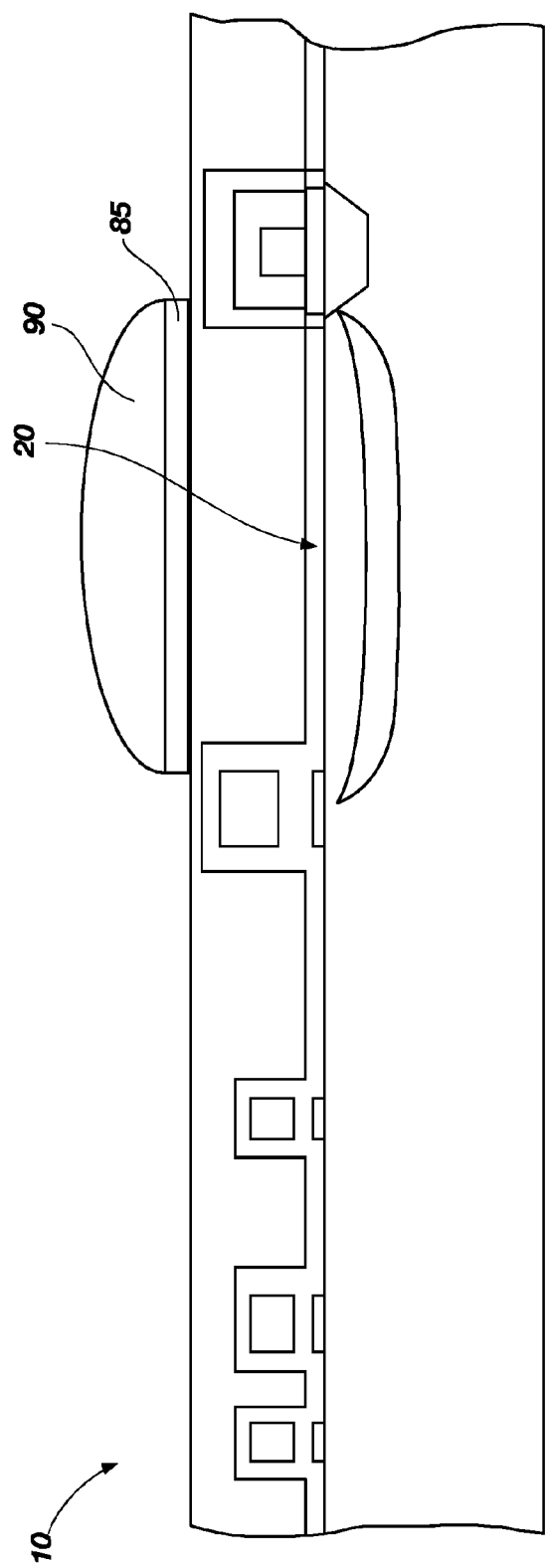

In some embodiments, as illustrated in FIG. 1B, a color filter array (CFA) 85 may be located over imager 10, or over at least image sensing element 20 thereof. Likewise, as is also illustrated in FIG. 1B, a microlens 90 may be present over each image sensing element 20.

After the foregoing features have been fabricated (e.g., by employing known techniques or processes described herein) substrate 12 may, in some embodiments of the present invention, be thinned. Known processes (e.g., grinding, wet etching, etc.) may be used to remove material from back side 16 of substrate 12 and, thus, to thin substrate 12. Substrate 12 may be thinned to any acceptable thickness (e.g., as thin as 100 μm in some embodiments, as thin as 50 μm in other embodiments, and even thinner substrates are contemplated as encompassed by the invention). In embodiments where imager 10 already includes contact plugs 64', the contact plugs 64' may be exposed as substrate 12 is thinned, potentially eliminating the need for the additional processing described in reference to FIGS. 3 through 7.

Once substrate 12 has a desired thickness, features may be fabricated on back side 16. An embodiment of such a back side fabrication process is depicted in FIGS. 2 through 9.

As illustrated in FIG. 2, imager 10 may be secured, dielectric film 50—down, to a carrier 200. In some embodiments, carrier 200 may comprise a glass substrate, while in other embodiments, carrier 200 may comprise a fabrication substrate (e.g., a silicon wafer). Dielectric film 50 may, in these and other embodiments of carrier 200, be secured to carrier 200 by way of a suitable adhesive material (e.g., a polymeric adhesive, etc.) that will withstand the fabrication temperatures (e.g., up to about 250° C.) to which imager 10 will be subsequently exposed. In still other embodiments, carrier 200 may be an electrostatic carrier, such as a carrier of the type described in Bock, K., et al., "Characterization of Electrostatic Carrier Substrates to be Used as a Support for Thin Semiconductor Wafers," Fraunhofer Institute for Reliability and Microintegration IZM-M (no date available), the entire disclosure of which is hereby incorporated herein by this reference, to which imager 10 is secured by electrostatic forces.

Figure 3:
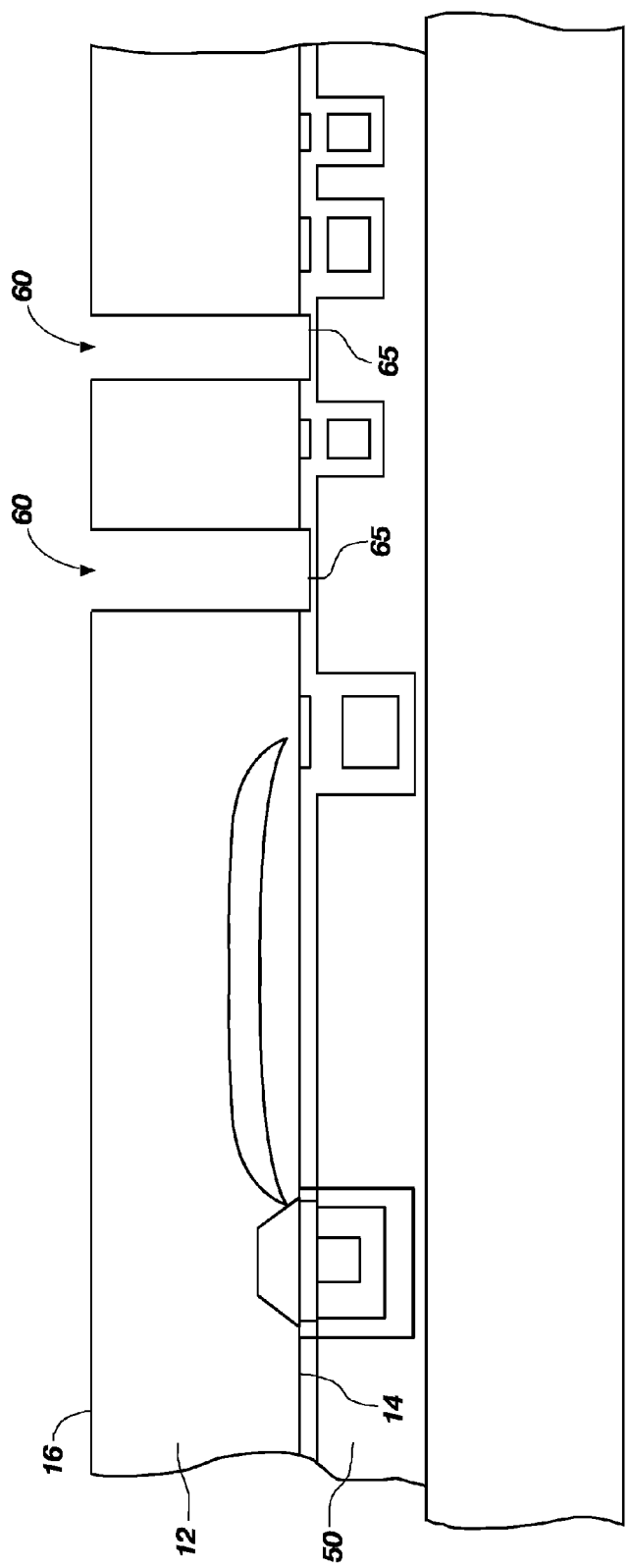

In FIG. 3, in embodiments where contact holes 60', dielectric liners 62', and contact plugs 64' (FIG. 1A) were not formed before securing imager 10 dielectric film 50—down to carrier 200, or in embodiments where additional contact holes 60, dielectric liners 61, and contact plugs 64' are desired, contact holes 60 may be formed from through substrate 12, from back side 16 thereof, toward active surface 14, to expose features 65 (e.g., source/drain regions, etc.) that, in conventional fabrication processes, would have been exposed by forming contact holes through dielectric film 50. The distance (e.g., diameter, etc.) across a contact hole 60 may be about 200 nm or less. In some embodiments, the distance across a contact hole 60 may be as small as about 100 nm, about 50 nm, or less. Contact holes 60 may be fabricated by known processes, such as by laser ablation or mask and etch processes. When mask and etch processes are used, a suitable mask (e.g., a transparent carbon mask, a hard mask, a photomask, etc.) (not shown) may be formed over back side 16 of substrate 12 and material may be removed from substrate 12 through the mask (e.g., by dry etch processes).

As contact holes 60 extend directly to very small features 65 (e.g., features that, in some embodiments, correspond to conductive line widths of about 100 nm or less) (e.g., source/drain regions, etc.) at active surface 14, contact holes 60 may have correspondingly small dimensions. As noted above, in some embodiments contact holes 60 may be about 200 nm or less across, or in diameter. In other embodiments, contact holes may be about 100 nm or less across, or in diameter.

Figure 4:
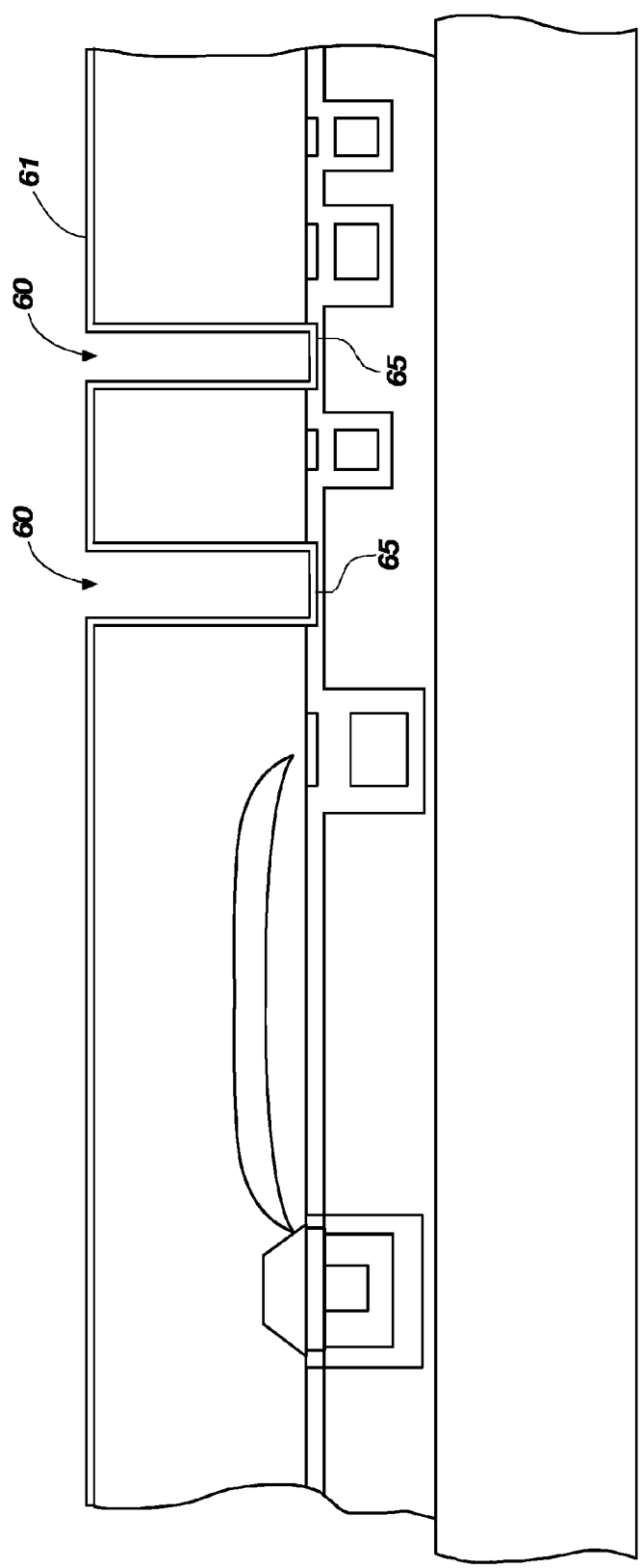

As shown in FIG. 4, contact holes 60 may be lined with dielectric material to electrically isolate conductive features, such as contact plugs 64 (FIG. 7), which are also referred to herein as "interconnects," and other conductive features, that are to be subsequently fabricated within contact holes 60 from substrate 12. In a specific embodiment, the dielectric material lining contact holes 60 may comprise silicon dioxide with trace amounts of aluminum. Dielectric liners 62 (FIGS. 5 and 6) may be formed by forming a thin dielectric film 61 (FIG. 4) within each contact hole 60. Known processes may be used to form dielectric film 61. In some embodiments, pulsed layer deposition (PLD) processes may be used to form dielectric film 61. In other embodiments, dielectric film 61 may be formed by low silane oxide (LSO) deposition processes.

Figure 5:
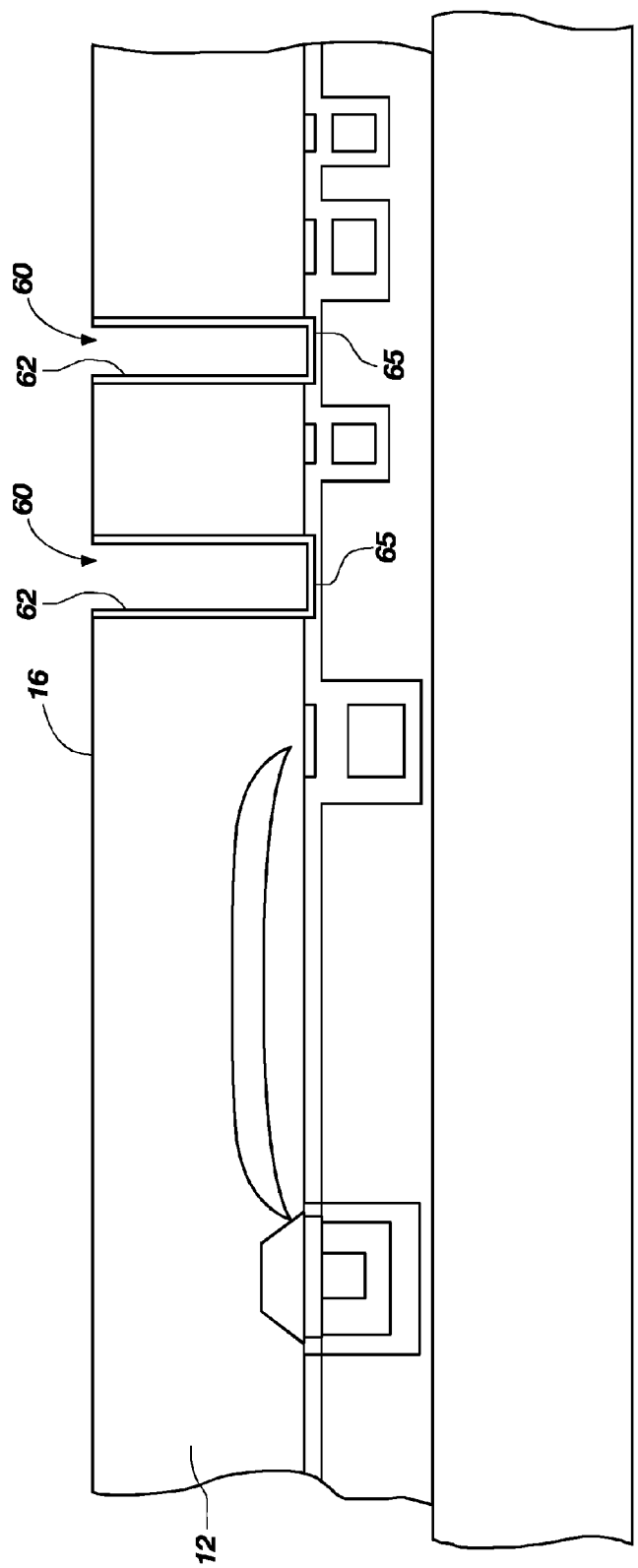
Figure 6:
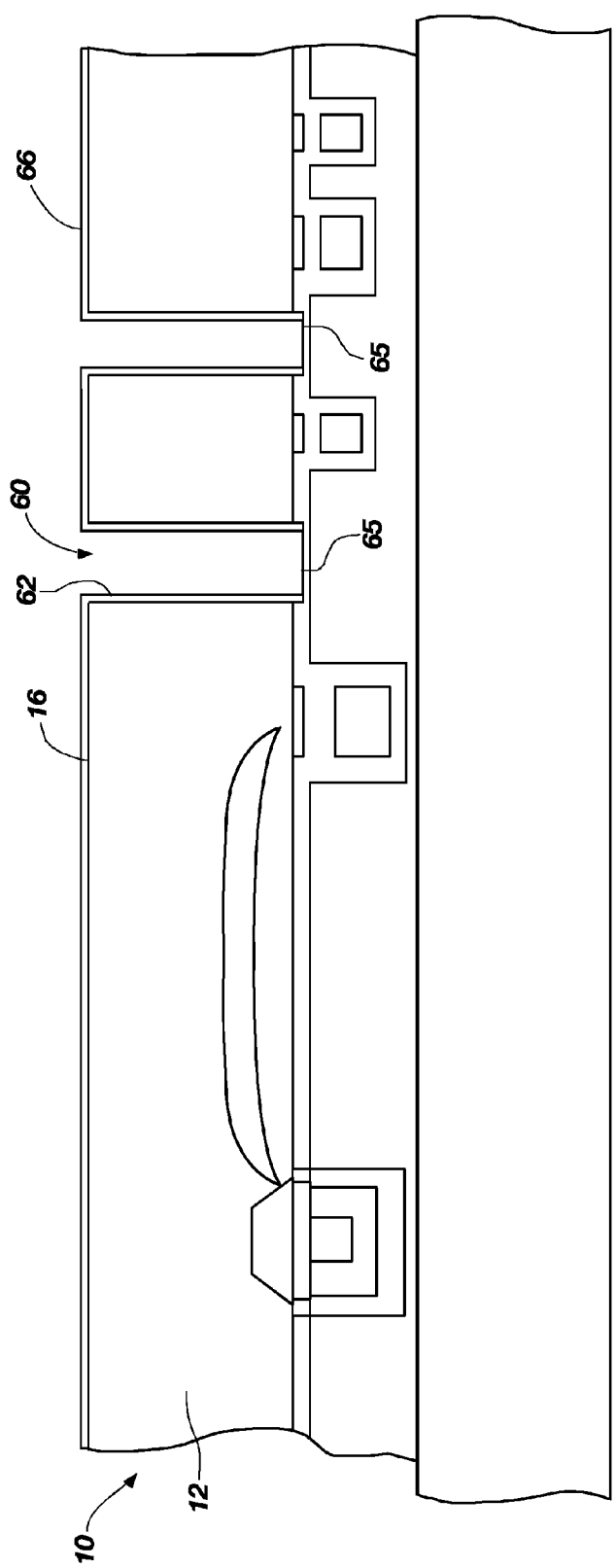

In embodiments where the dielectric film 61 covers features 65 to which electrical contacts are to be made, dielectric film 61 is removed from features 65 to re-expose the same to contact holes 60, as depicted in FIGS. 5 and 6.

In some embodiments, such re-exposure may be effected by way of a so-called "spacer etch," which is a dry etch in which portions of an etched film that are oriented in substantially the same direction as (i.e., substantially parallel to) that in which the etch is to be effected (e.g., portions of dielectric film 61 (FIG. 4) on the side walls of contact holes 60) remain substantially unetched, while portions of the etched film that are oriented differently (i.e., substantially transverse to the direction of the etch) are removed. More specifically, portions of dielectric film 61 on features 65 are removed and, as shown in FIG. 5, portions of dielectric film 61 on back side 16 of substrate 12 may also be removed, leaving dielectric liners 62 on surfaces of contact holes 60.

Alternatively, in other embodiments, a mask (e.g., a photomask, a hard mask, a transparent carbon mask, any combination of the foregoing, etc.) (not shown) of a type known in the art may be formed over dielectric film 61 (FIG. 4). Apertures of the mask may be configured and aligned so as to facilitate exposure of portions of dielectric film 61 that cover features 65, with which electrical contact is to be established, to a suitable, known anisotropic etchant (e.g., a dry etchant). When imager 10, the mask, and regions of dielectric film 61 that are exposed through the mask are contacted, by known techniques, by the isotropic etchant, material is removed from the contacted regions of dielectric film 61, re-exposing features 65. Following the re-exposure of features 65 through dielectric film 61, the mask may be removed. Regions of dielectric film 61 that remain on surfaces of contact holes 60 form dielectric liners 62, while regions of dielectric film 61 that overlie back side 16 of substrate 12 may remain as a back side dielectric layer 66, as shown in FIG. 6.

Figure 7:
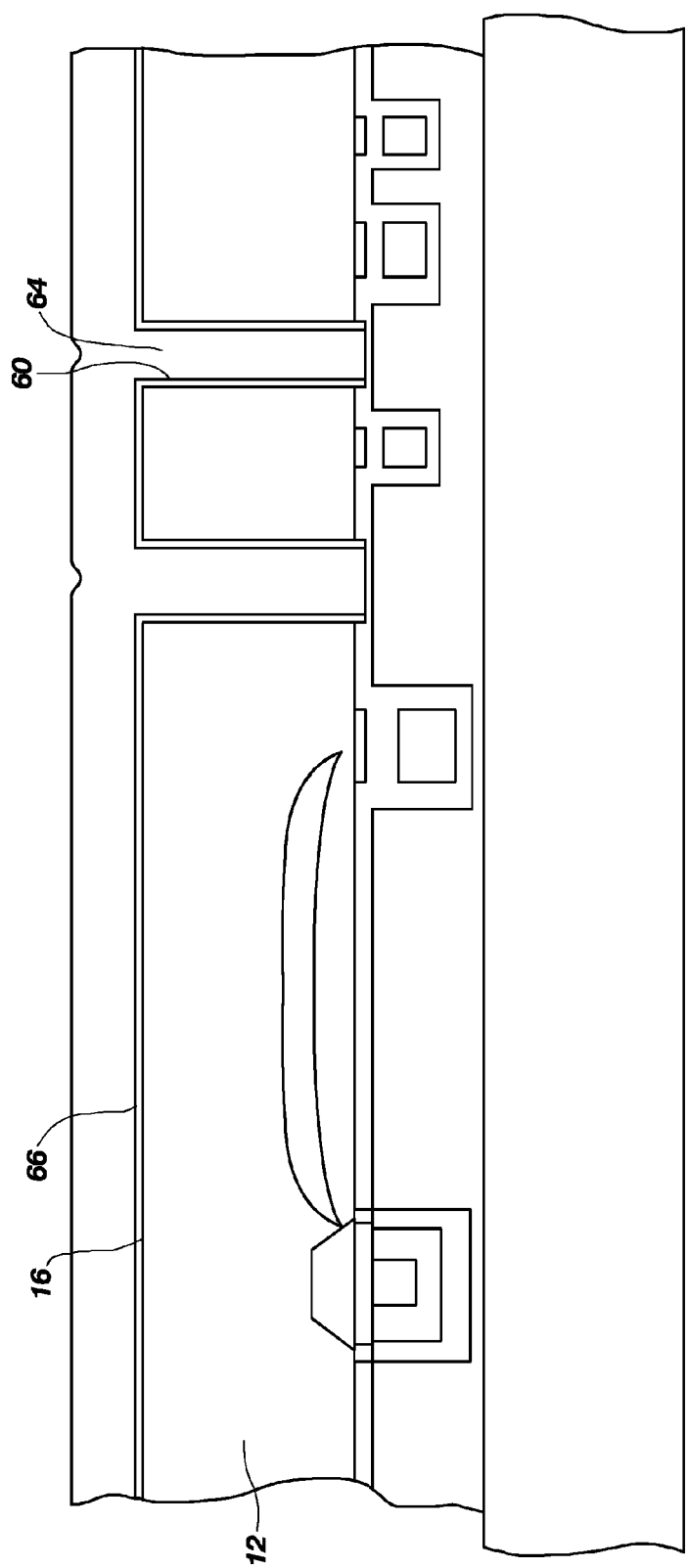

Conductive features, including contact plugs 64, may then be formed in contact holes 60, as shown in FIG. 7. Known processes may be used to fabricate contact plugs 64 and conductive features within contact holes 60. Thus, in some embodiments, diffusion barriers (e.g., titanium nitride, tungsten nitride, etc.) and/or interconnects (e.g., metal silicides) may be formed in contact holes 60 to provide desirable electrical connectivity between a contact plug 64 and a contacted feature, without undesirable interdiffusion between the materials of contact plug 64 and the contact feature. Regardless of whether diffusion barriers or interconnects are fabricated within contact holes 60, known processes (e.g., chemical vapor deposition (CVD), PLD, atomic layer deposition (ALD), etc.) may be used to introduce conductive material into contact holes 60 and, thus, to form contact plugs 64 within contact holes 60.

Some embodiments of contact plugs 64 may be formed by filling or substantially filling contact holes 60 with conductive material (e.g., by known deposition processes). Other embodiments of contact plugs 64 may be fabricated by forming (e.g., by deposition processes) one or more films, or coatings, of conductive material (e.g., polysilicon, etc.) on a surface of each contact hole 60 (i.e., on dielectric liner 62, a diffusion barrier, an interconnect, etc.), then filling (e.g., by deposition processes, plating processes, etc.) any void remaining within the contact hole 60 with a conductive material (e.g., polysilicon, tungsten, etc.) or a dielectric material.

In embodiments where the material layer or layers from which contact plugs 64 are formed are electrically isolated from back side 16 of substrate 12 by back side dielectric film 66 (see, e.g., FIG. 6), the material layer or layers may remain on back side dielectric film 66 for further processing, or they may be removed by known processes (e.g., CMP, wet etching, etc.).

In other embodiments, where back side 16 of substrate 12 was not covered by a back side dielectric layer 66 prior to the fabrication of contact plugs 64 (see, e.g., FIG. 5), any conductive material remaining on back side 16 is removed. Known processes, such as CMP and/or or wet etching, may be used to remove conductive material from back side 16.

Figure 8:
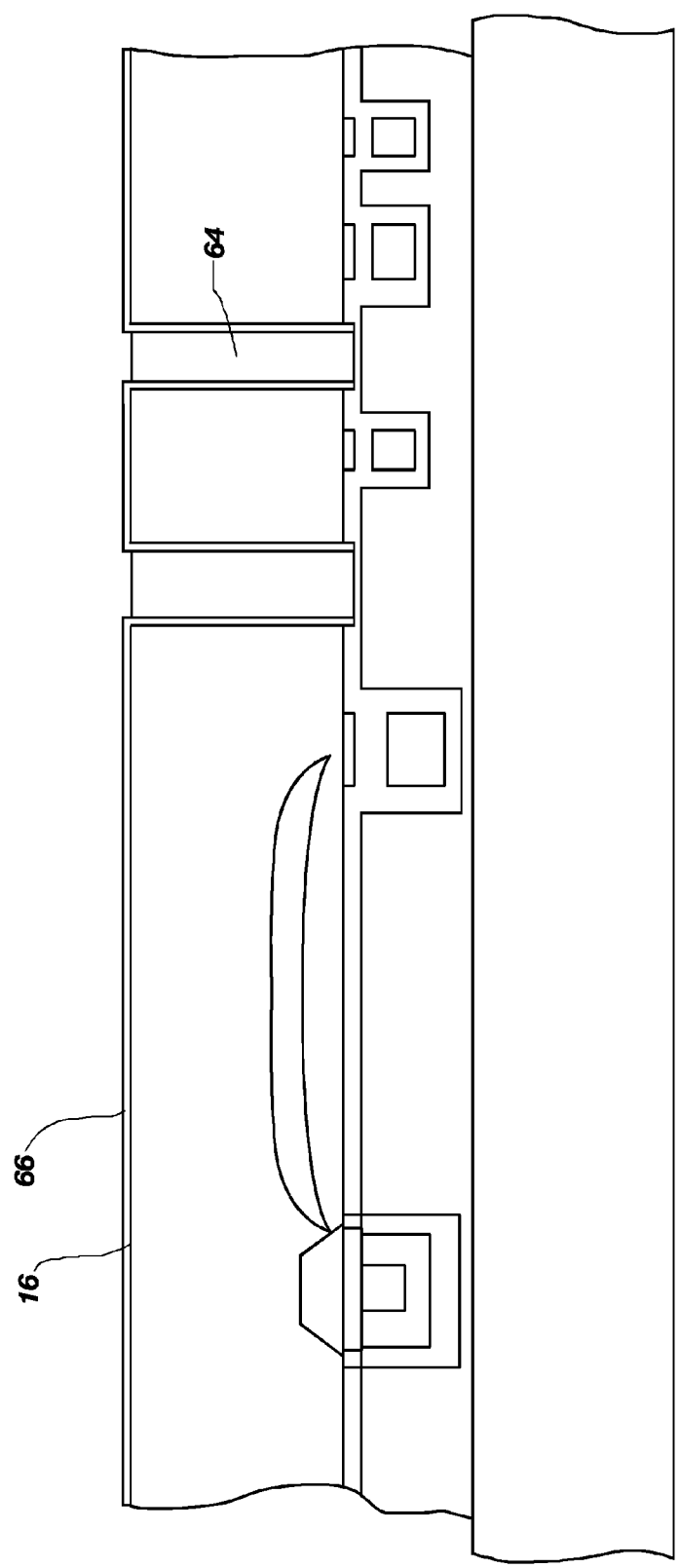

In such embodiments, as well as in imager 10 embodiments in which contact plugs 64' are formed through active surface 14 of substrate 12 rather than through back side 16 thereof, such as the embodiment shown in FIG. 1A, one or more layers of dielectric material may be formed on (e.g., by thermal growth, deposition techniques, etc.) or applied to (e.g., by spin-on techniques, etc.) back side 16. Contact plugs 64 may then be exposed (e.g., by mask and etch processes) through the resulting layer of dielectric material. The result is a back side dielectric layer 66, as shown in FIG. 8.

Figure 9:
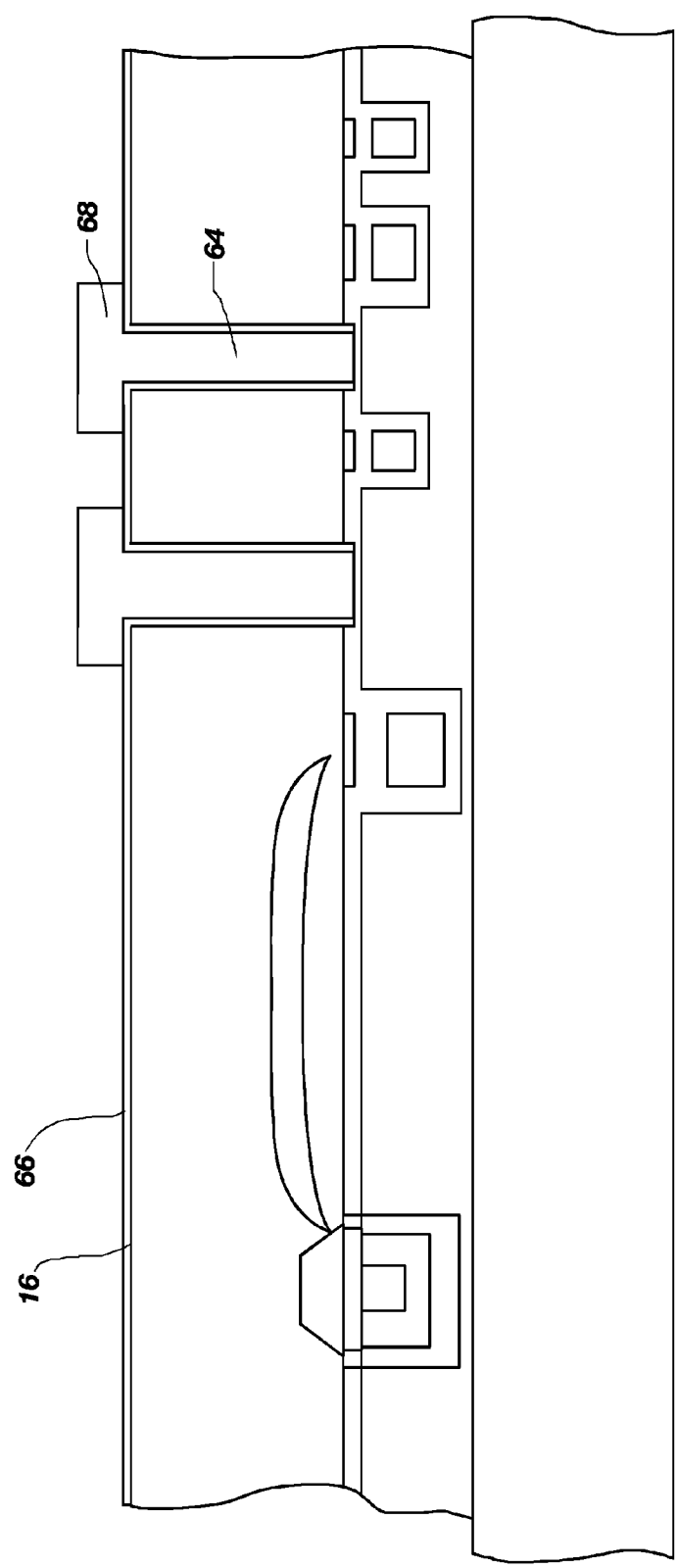

Next, as shown in FIG. 9, conductive lines 68 that are connected to contact plugs 64 and that extend laterally over back side 16 may be fabricated. In embodiments where one or more layers of conductive material already overlie back side dielectric layer 66, conductive lines 68 may be fabricated from the one or more layers of conductive material and any associated material layers. Alternatively, one or more material layers, including one or more layers of conductive material, may be formed over dielectric layer 66, as known in the art (e.g., by deposition processes, etc.), to facilitate fabrication of conductive lines 68. Once the appropriate material layer or layers are present on dielectric layer 66, laterally extending conductive lines 68 may be fabricated by known processes (e.g., mask and etch techniques).

Figure 10:
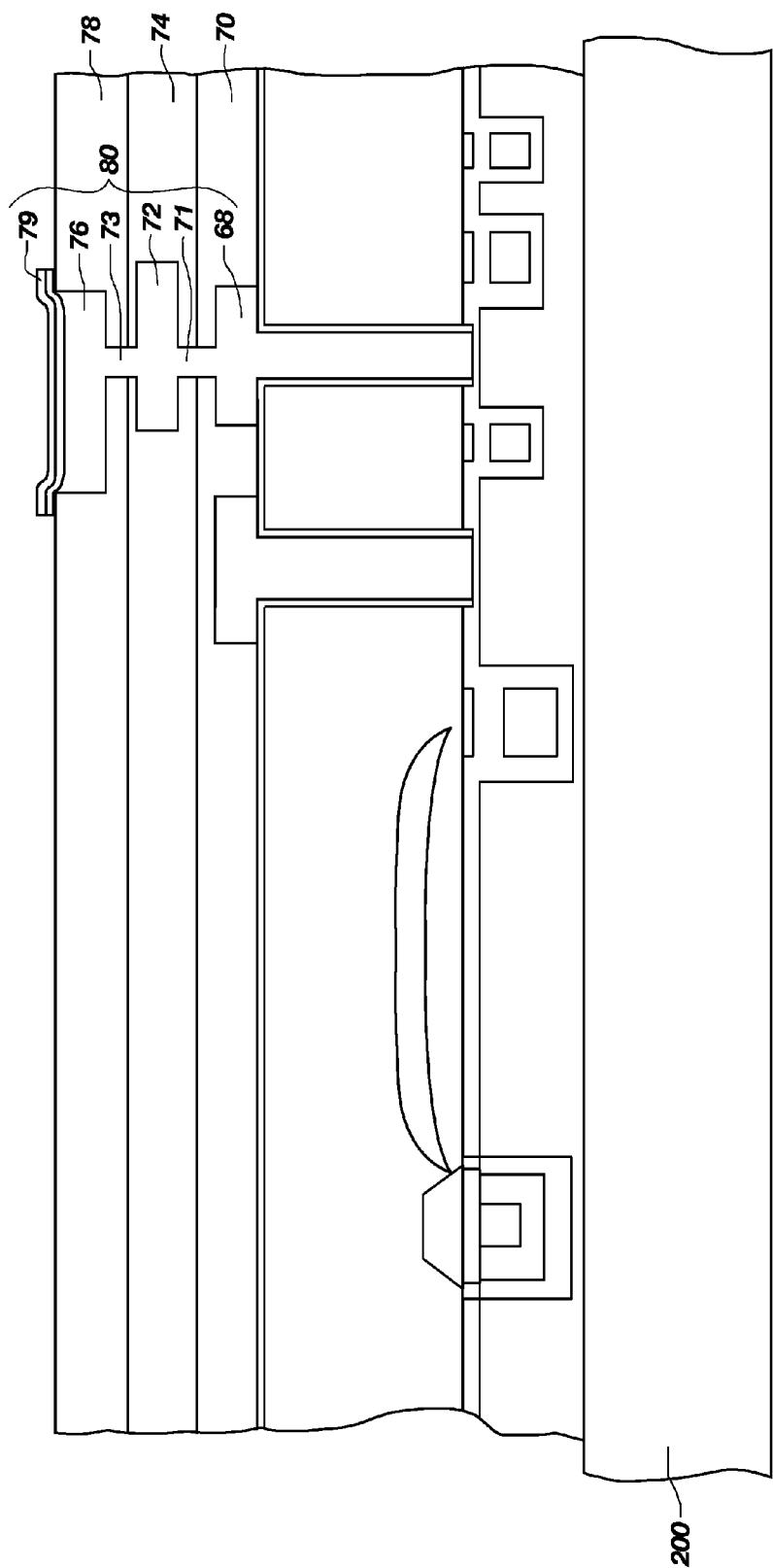

Further processing may continue, as known in the art, to form additional interlayer dielectric films 70, 74, laterally extending conductive lines 72, 76, interlayer contacts or interconnects 71, 73, and any other desired semiconductor device features, as well as a protective layer 78 and external contacts 79 (e.g., bond pads), to fabricate a completed imager 10 with back side integrated circuitry 80, as shown in FIG. 10.

Figure 11:
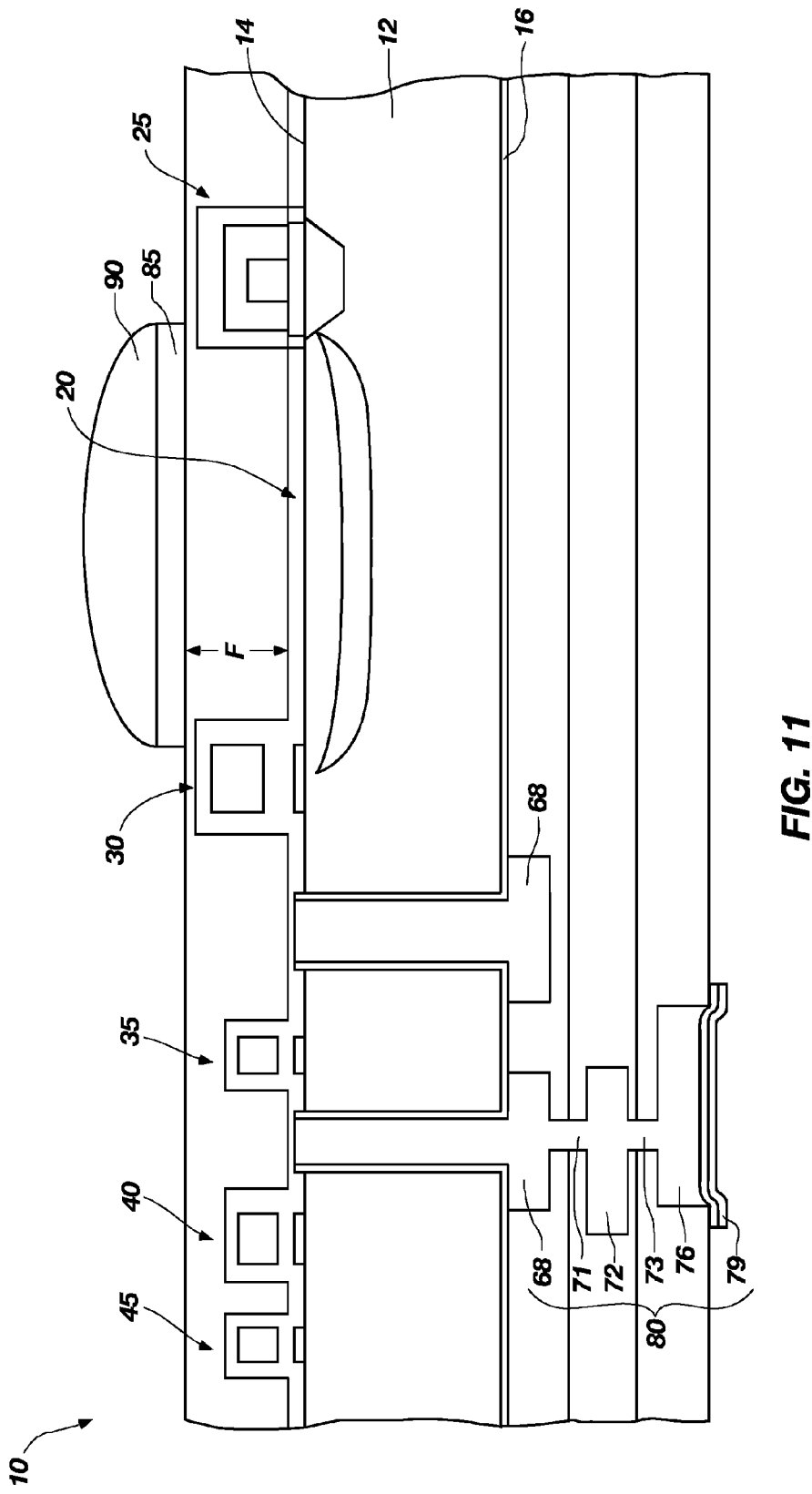
FIG. 11 is a partial cross-sectional representation of an embodiment of an imager including contact holes extending through a substrate thereof, as well as circuitry carried by a back side of the substrate.

Referring now to FIG. 11, once back side integrated circuitry 80 has been fabricated, imager 10 may be removed from carrier 200 (FIG. 10) and, if necessary or desired, cleaned. As illustrated, in some embodiments, including embodiments in which color filter arrays and/or microlenses were not previously formed, a color filter array 85 may be formed on or applied to imager 10, over at least image sensing element 20 thereof. CFA 85 may be disposed upon imager 10 by known processes. Likewise, known processes may, if desired, be used to form or place a microlens 90 over image sensing element 20.

As at least some conductive lines 68, 72, 76 and external contacts 79 are carried by back side 16 of substrate 12, they may extend across locations that are opposite from image sensing element 20 and, thus are not confined to the periphery of imager 10. Consequently, electrical and other design constraints may be eased with back side integrated circuitry 80, while the overall size of the chip may be reduced relative to state-of-the-art imagers. Further, back side integrated circuitry 80 eliminates the additional processes and costs associated with fabricating conductive features, such as edge-bound conductive traces or TWIs or conductive vias, to reroute circuitry from above the active surface of an imager substrate to its back side.

Additionally, by placing such metallization on back side 16, in some embodiments, the features that are fabricated on active surface 14 of substrate 12 of imager 10 protrude only a small distance from active surface 14 (e.g., about one-half micron or less in embodiments where no conductive lines extend over photocell capacitor 25 or imager transistors 30-45) and, thus, above image sensing element 20. When compared with the typical seven to ten microns that features of state-of-the-art imagers protrude from the active surfaces of the substrates of such imagers, the distance, or focal length F, between image sensing element 20 and any optical elements (e.g., CFA 85, microlens 90, glass, lenses, filters, etc.) to be positioned thereover is significantly reduced. In some embodiments, the reduction in focal length F may be sufficient to eliminate the use of a microlens array over image sensing element 20. Accordingly, some embodiments of imagers 10 of the present invention neither include nor require microlenses.

While the foregoing description is limited to embodiments of photoimagers with contact openings that extend exclusively through the substrate, embodiments of photoimagers that additionally include contact openings that extend through features fabricated over the active surfaces thereof are also within the scope of the present invention.

Figure 12:
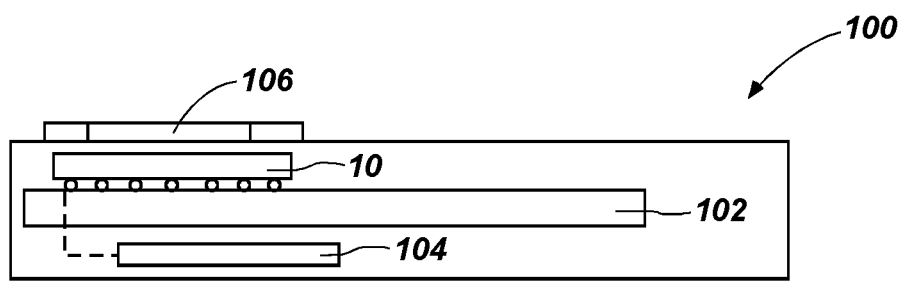
FIG. 12 is a schematic representation depicting an embodiment of an electronic device that includes an imager according to various embodiments of the present invention.

With reference to FIG. 12, an electronic device 100 that includes a photoimager 10 according to embodiments of the present invention is depicted. Photoimager 10 is electrically connected to a carrier 102, such as a circuit board, that communicates with or carries other semiconductor devices 104, such as a processor, memory, and the like, as well as with a power source, input/output devices (e.g., wired and wireless communications ports, etc.), a video display, and a variety of other devices known in the art. In some embodiments, electronic device 100 may include one or more optical elements 106, such as glass, one or more lenses, filters, or the like. Without limiting the scope of the present invention, in specific embodiments, the electronic device 100 may comprise a camera, a cellular telephone, a personal digital assistant (PDA), a personal computer, or any other device into which a camera may be incorporated.

Although the foregoing description includes many specifics, these should not be construed as limiting the scope of the present invention but, merely, as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A semiconductor device, comprising:
   a semiconductor substrate comprising an active surface and an opposing back side surface;
   at least one capacitor at the active surface of the semiconductor substrate;
   electrically conductive material electrically connected to an electrode of the at least one capacitor and extending to the back side surface of the semiconductor substrate;
   longitudinally spaced, laterally extending conductive elements extending over the back side surface of the semiconductor substrate and electrically connected to the electrically conductive material, wherein each longitudinally spaced, laterally extending conductive element is at least partially embedded within a distinct region of dielectric material located on a side of the back side surface of the semiconductor substrate opposite the active surface, each distinct region of dielectric material comprising a boundary in contact with an adjacent region of dielectric material; and
   at least one external contact located adjacent to an outermost distinct region of dielectric material and electrically connected to at least one of the longitudinally spaced, laterally extending conductive elements.

2. The semiconductor device of claim 1, further comprising:
   at least one contact opening extending from the active surface to the back side surface of the semiconductor substrate; and
   a dielectric material disposed on a sidewall of the at least one contact opening, wherein the electrically conductive material is disposed within the at least one contact opening adjacent the dielectric material.

3. The semiconductor device of claim 2, wherein the at least one contact opening comprises a conductive via and the electrically conductive material comprises an elongate, solid element.

4. The semiconductor device of claim 2, wherein the electrically conductive material disposed within the at least one contact opening extends between a lowermost electrode of the at least one capacitor and at least one longitudinally spaced, laterally extending conductive element extending over the back side surface of the semiconductor substrate.

5. The semiconductor device of claim 1, further comprising at least one transistor at the active surface of the semiconductor substrate, the at least one transistor comprising at least one of a transfer gate, a reset gate, a source follower gate, or a row select gate.

6. The semiconductor device of claim 5, wherein:
   the at least one capacitor is a photocell capacitor further comprising an underlying shallow trench isolation structure; and
   the at least one transistor is an imager transistor located laterally adjacent to and in communication with the photocell capacitor.

7. The semiconductor device of claim 6, further comprising at least one image-sensing element at the active surface of the semiconductor substrate, the at least one image-sensing element located laterally adjacent the photocell capacitor and the imager transistor.

8. A semiconductor device, comprising:
   a substrate comprising semiconductor material located between an active surface and an opposing back side surface;
   at least one external contact proximate the back side surface;
   distinct regions of dielectric material located between the at least one external contact and the back side surface of the substrate, each distinct region of dielectric material comprising a boundary in contact with an adjacent region of dielectric material;
   longitudinally spaced, laterally extending conductive elements extending over the back side surface of the substrate, each longitudinally spaced, laterally extending conductive element at least partially embedded within a distinct region of dielectric material;
   electrically conductive material in contact openings that extend between the active surface and the back side surface of the substrate; and
   at least one capacitor located at the active surface of the substrate, wherein the electrically conductive material provides electrical communication between at least one terminal of the at least one capacitor and at least one longitudinally spaced, laterally extending conductive element extending over the back side surface of the substrate.

9. The semiconductor device of claim 8, further comprising one or more optical elements located at the active surface of the substrate, wherein the one or more optical elements comprises an array of photodiodes, the longitudinally spaced, laterally extending conductive elements extending laterally underneath the array of photodiodes.

10. The semiconductor device of claim 8, further comprising at least one transistor, wherein at least one contact opening is substantially beneath the at least one transistor, the electrically conductive material within the at least one contact opening extending to a source, a drain, or a gate of the at least one transistor.

11. The semiconductor device of claim 10, wherein the longitudinally spaced, laterally extending conductive elements operatively connected to a first transistor extend laterally underneath a second, different transistor to which the longitudinally spaced, laterally extending conductive elements are not operatively connected.

12. The semiconductor device of claim 8, wherein the at least one terminal of the at least one capacitor comprises a lowermost metal plate of at least two metal plates located at the active surface of the substrate.

13. The semiconductor device of claim 8, wherein the at least one external contact comprises a bond pad and the longitudinally spaced, laterally extending conductive elements comprise conductive traces.

14. The semiconductor device of claim 8, wherein:
the longitudinally spaced, laterally extending conductive elements are not confined to a periphery of the substrate; and
no longitudinally spaced, laterally extending conductive elements extend over the active surface of the substrate.

15. An apparatus, comprising:
a carrier substrate; and
at least one semiconductor device carried by the carrier substrate, the at least one semiconductor device comprising:
 a semiconductor substrate comprising an active surface opposite a back side surface;
 at least one capacitor proximate the active surface of the semiconductor substrate;
 at least one interconnect electrically connecting the at least one capacitor with the back side surface of the semiconductor substrate;
 longitudinally spaced, laterally extending conductive elements carried by the back side surface of the semiconductor substrate and electrically connected to the at least one interconnect;
 distinct regions of dielectric material, each distinct region surrounding a corresponding longitudinally spaced, laterally extending conductive element, each distinct region of dielectric material in direct contact with an adjacent distinct region of dielectric material; and
 at least one external contact located adjacent to an outermost distinct region of dielectric material and electrically connected to at least one of the longitudinally spaced, laterally extending conductive elements.

16. The apparatus of claim 15, further comprising image-sensing elements and transistors, wherein the at least one capacitor is located laterally adjacent the image-sensing elements and the transistors.

17. The apparatus of claim 16, further comprising an imperforate dielectric material on the active surface of the semiconductor substrate, the imperforate dielectric material covering and in contact with the at least one capacitor, the image-sensing elements and the transistors.

18. The apparatus of claim 17, wherein a distance between the active surface of the semiconductor substrate and an outermost planar surface of the imperforate dielectric material is at most about one-half micron.

19. The apparatus of claim 15, wherein the at least one interconnect electrically connecting the at least one capacitor with the back side surface of the semiconductor substrate comprises the at least one interconnect electrically connecting a lowermost electrode of the at least one capacitor with at least one longitudinally spaced, laterally extending conductive element carried by the back side surface of the semiconductor substrate.

20. The apparatus of claim 19, wherein the at least one longitudinally spaced, laterally extending conductive element electrically connected to the lowermost electrode of the at least one capacitor extends laterally underneath other, different capacitors to which the at least one longitudinally spaced, laterally extending conductive element is not electrically connected.

* * * * *